United States Patent
Ali et al.

(10) Patent No.: US 10,177,214 B2
(45) Date of Patent: *Jan. 8, 2019

(54) METAL THIN FILM RESISTOR AND PROCESS

(71) Applicant: Texas Instruments Incorporated, Dallas, TX (US)

(72) Inventors: Abbas Ali, Plano, TX (US); Eric Beach, Tucson, AZ (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/357,796

(22) Filed: Nov. 21, 2016

(65) Prior Publication Data

US 2017/0069708 A1  Mar. 9, 2017

Related U.S. Application Data

(62) Division of application No. 14/548,812, filed on Nov. 20, 2014, now Pat. No. 9,502,284.

(60) Provisional application No. 61/922,155, filed on Dec. 31, 2013.

(51) Int. Cl.
   *H01L 49/02* (2006.01)
   *H01L 21/768* (2006.01)
   *H01L 23/522* (2006.01)
   *H01L 23/528* (2006.01)
   *H01L 23/532* (2006.01)

(52) U.S. Cl.
   CPC .......... *H01L 28/24* (2013.01); *H01L 21/7681* (2013.01); *H01L 21/76834* (2013.01); *H01L 23/528* (2013.01); *H01L 23/5226* (2013.01); *H01L 23/5228* (2013.01); *H01L 23/5329* (2013.01); *H01L 23/53295* (2013.01); *H01L 23/53223* (2013.01); *H01L 2924/0002* (2013.01)

(58) Field of Classification Search
   CPC ........ H01C 7/006; H01L 45/145; H01L 45/04
   See application file for complete search history.

(56) References Cited

U.S. PATENT DOCUMENTS

| 6,734,076 B1 * | 5/2004 | Jaiswal .................. H01L 21/768 257/E21.004 |
| 7,323,751 B2 | 1/2008 | Beach et al. |
| 2006/0181388 A1 * | 8/2006 | Chinthakindi ......... H01C 7/006 338/309 |

(Continued)

FOREIGN PATENT DOCUMENTS

| EP | 1526575 A2 | 4/2005 |
| RU | 2474921 C1 | 2/2013 |
| WO | 2006/088709 A1 | 8/2006 |

OTHER PUBLICATIONS

International Search Report and Written Opinion, PCT/US2014/073001 dated Aug. 20, 2015 (6 pages).

(Continued)

*Primary Examiner* — Fernando L Toledo
*Assistant Examiner* — Neil Prasad
(74) *Attorney, Agent, or Firm* — Jacqueline J. Garner; Charles A. Brill; Frank D. Cimino

(57) ABSTRACT

An integrated circuit with a metal thin film resistor with an overlying etch stop layer. A process for forming a metal thin film resistor in an integrated circuit with the addition of one lithography step.

15 Claims, 4 Drawing Sheets

(56) References Cited

U.S. PATENT DOCUMENTS

| | | |
|---|---|---|
| 2007/0166909 A1 | 7/2007 | Coker et al. |
| 2008/0237800 A1 | 10/2008 | Chinthakindi et al. |
| 2010/0237467 A1 | 9/2010 | Dalton et al. |
| 2013/0093024 A1 | 4/2013 | Eshun |
| 2013/0334659 A1 | 12/2013 | Liu et al. |
| 2014/0103489 A1* | 4/2014 | Dirnecker ............... H01L 28/24 257/532 |

OTHER PUBLICATIONS

Prosecution History from U.S. Appl. No. 14/548,812, dated Nov. 20, 2014 to Nov. 3, 2016 (213 pages).
Supplementary European Search Report and Search Opinion, Application No. 14876139.8, dated Jul. 19, 2017 (10 pages).

* cited by examiner

METAL THIN FILM RESISTOR AND PROCESS

CROSS-REFERENCE TO RELATED APPLICATIONS

This application is a continuation of U.S. patent application Ser. No. 14/548,812, filed Nov. 20, 2014, which claims the benefit of U.S. Provisional Application 61/922,155, filed Dec. 31, 2013, both of which are incorporated herein by reference in their entirety.

FIELD OF THE INVENTION

This invention relates to the field of integrated circuits. More particularly, this invention relates to forming a metal thin film resistor within the interconnect layers in integrated circuits.

BACKGROUND OF THE INVENTION

Metal thin film resistors are well known and may be formed using a variety of resistive metals. Nichrome (NiCr) and sichrome (CrSi) are two that are commonly used. These types of thin-film resistors are formed in the back end (BEOL) of an integrated circuit manufacturing flow. BEOL resistors have less parasitic capacitance than resistors (typically polysilicon, silicide, or nwell) formed in the front end of line (FEOL) since they are formed at a greater distance from the substrate. BEOL resistors are preferred for high frequency RF applications because of the lower capacitance.

Integrating a metal thinfilm resistor in the BEOL of an integrated circuit manufacturing flow adds cost and cycle time. A typical metal thinfilm resistor is illustrated in FIG. 1. The metal thin film resistor 112 is formed on a third dielectric layer 110. The third dielectric layer is formed on an etch stop layer 108 which overlies lower interconnect leads 104. The lower interconnect leads 104 are embedded in a second dielectric layer 106. The lower interconnect leads 104 may be a first level of interconnect connected to diodes in an underlying integrated circuit 100 through a contact 101 or may be connected to an underlying level of interconnect through a via 101.

The area of the metal thin film resistor 112 is defined by a first resistor photoresist pattern. A second resistor photoresist pattern is used to define via landing pads 114 that form electrical contact to each end of the metal thin film resistor 112. The via landing pads 114 protect the thin metal thin film resistor from damage during etching of the resistor vias 120 and 122 which may result in high via resistance. A third resistor photoresist pattern is used to form openings for vias, 120 and 122, to make electrical connection to the via landing pads 114.

The cost of 3 additional lithography steps plus additional process steps to form the via landing pads 114 and to form resistor vias, 120 and 122 adds considerable expense and cycle time to the manufacturing flow.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit with a metal thin film resistor with an overlying etch stop layer is disclosed. The overlying etch stop layer negates the need for the formation of resistor via landing pads and the need for separate resistor via patterning and etching steps.

Also disclosed is a process for forming a metal thin film resistor in an integrated circuit with the addition of one lithography step.

DETAILED DESCRIPTION

Figure 1:
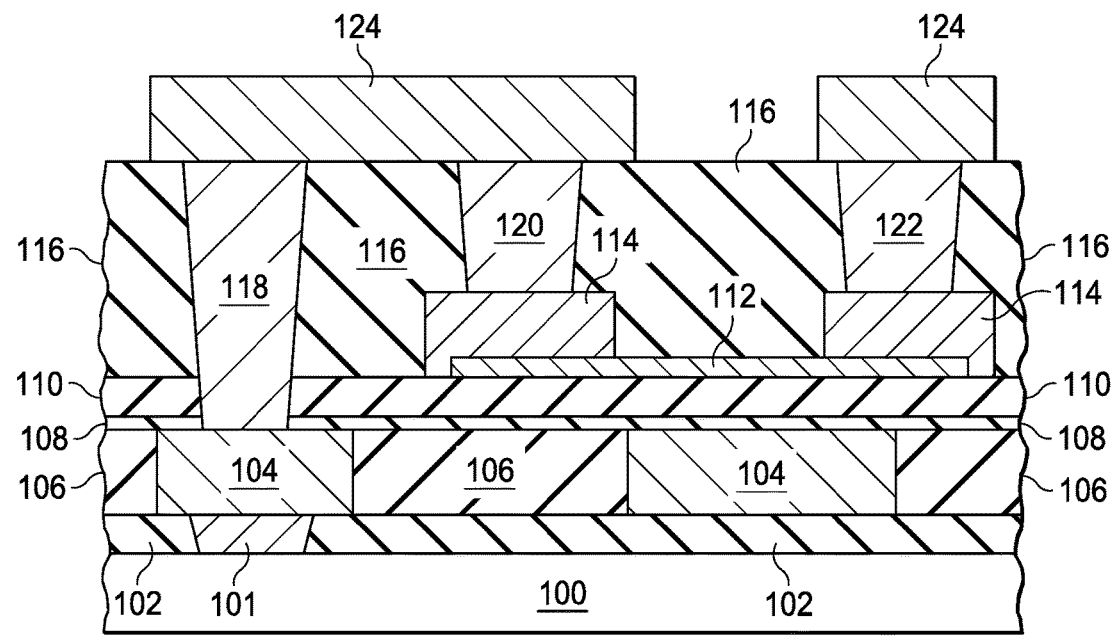
FIG. 1 (Prior art) is a cross-section of resistor.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Figure 2:
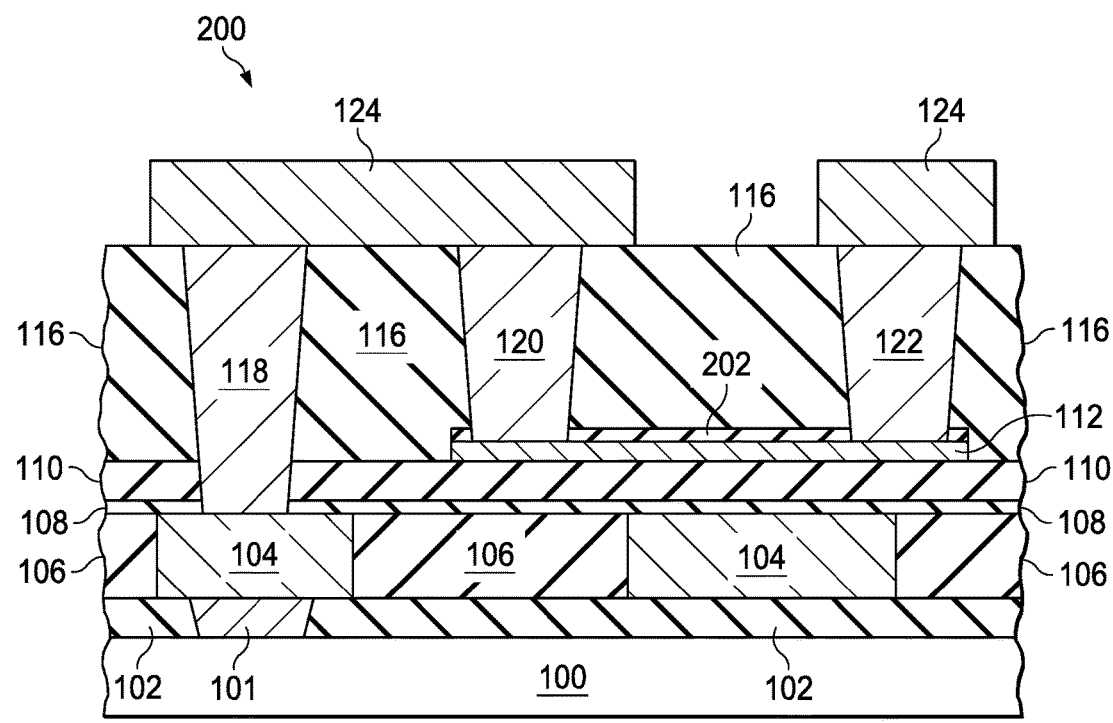
FIG. 2. Is a cross-section of an embodiment metal thin film resistor.

FIG. 2 is an illustration of a metal thin film resistor formed according to embodiments. The embodiment metal thin film resistor in FIG. 2 differs from the previously described prior art metal thin film resistor in FIG. 1. A via etch stop layer 202 overlies the metal thin film resistor 112 in FIG. 2, and there are no via landing pads 114 protecting the ends of the metal thin film resistor 112.

A lower level of interconnect 104 (under the metal thin film resistor 112) is formed in dielectric layer 106. Dielectric layer 106 and lower level of interconnect 104 are disposed on a dielectric layer 102 which overlies a partially process integrated circuit 100. The partially processed integrated circuit may be processed through contact or through one or more levels of interconnect. The contact/via 101 under the lower level of interconnect 104 through dielectric layer 102 may be contact to substrate or may be a via to a lower level of interconnect. An etch stop layer 108 may overly the lower level of interconnect 104 and dielectric layer 106. A thin layer of dielectric 110 overlies etch stop layer 108. The metal thin film resistor 112 is formed on dielectric layer 110. Etch stop layer 202 may covers the upper surface of the metal thin film resistor 112 and is etched prior to etching the metal thin film resistor 112 using the resistor photoresist pattern. A thick dielectric layer 116 (interlevel dielectric layer or ILD) is formed on dielectric layer 110 and on etch stop layer 202.

Upper level interconnect geometries 124 are formed on ILD layer 116. Vias 118 form electrical connection between the upper level interconnect geometry 124 and the lower level interconnect geometry 104. Vias 120 and 122 form electrical connection between upper level interconnect geometries and the ends of the metal thin film resistor 112. The etch stop layer 202 on top of the metal thin film resistor 112 enables the resistor vias 120 and 122 to be formed at the same time as the interconnect via 118 without damage to the ends of the metal thin film resistor due to via overetching.

FIGS. 3A through 3E illustrate a method for integrating a metal thin film resistor into an integrated circuit using one additional photoresist patterning step. This process flow significantly reduces cost and cycle time over the three photoresist patterning process used in the prior art process described in FIG. 1.

A non-dual damascene process flow is used to illustrate the method. Those skilled in the art may readily adapt the method to dual damascene interconnect process flows.

Figure 3A:
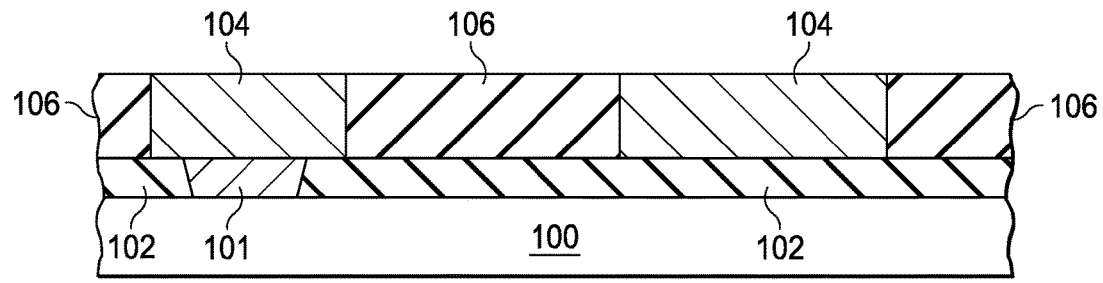
FIG. 3A through FIG. 3E are illustrations of steps in the fabrication of integrated resistor formed according to embodiments.

In FIG. 3A shows an integrated circuit 100 with a first dielectric layer 102 overlying the integrated circuit 100. Lower interconnect geometries 104 which are embedded in a second dielectric layer 106 are formed on dielectric layer 102. The lower interconnect geometries 104 may be aluminum, aluminum-copper alloy, titanium plus aluminum alloy, or TiW plus aluminum alloy. The lower interconnect geometries may also be copper formed using a dual damascene process. First dielectric layer 102 and second dielectric layer 106 may be a dielectric such as silicon dioxide deposited using plasma excited chemical vapor deposition (PECVD) or plasma excited TEOS deposition (PETEOS), or may be a low-k dielectric.

Figure 3B:
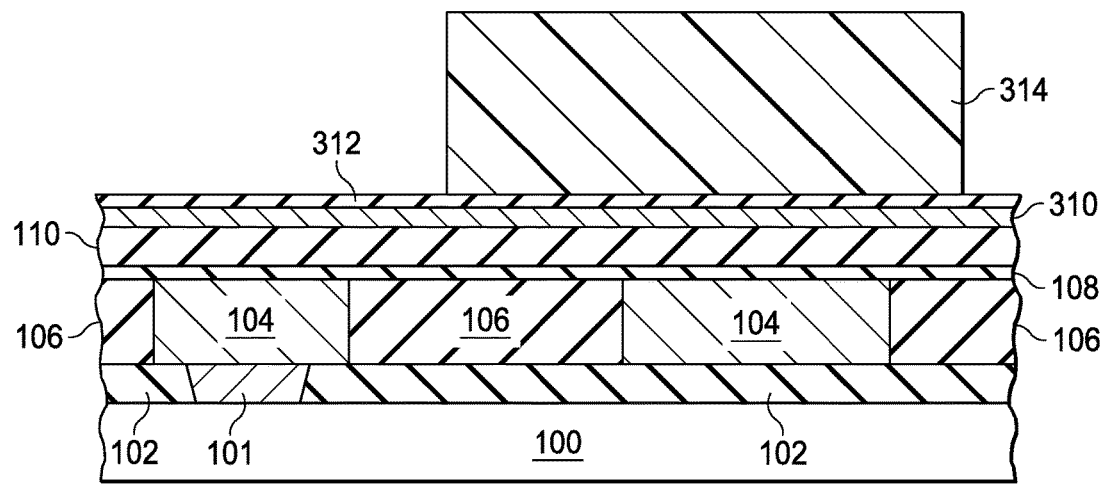

Etch stop layer, 108, may then be deposited followed by a thin dielectric layer 110 as shown in FIG. 3B. The etch stop layer, 108, may be a dielectric such as SiN, SiON, SiC, or $Al_2O_3$ with a thickness in the range of about 20 nm to 200 nm. Dielectric layer 110 may be a dielectric material such as PECVD oxide with a thickness of between about 50 nm to 300 nm. Resistor material, 310, such as nichrome (NiCr) or sichrome (CrSi) with a thickness in the range of about 1.5 nm to 40 nm is then deposited. The resistor material 310 may be deposited using a physical vapor deposition (PVD) process such as sputtering. The resistor material 310 is then capped with an etch stop layer, 312. The etch stop material is a dielectric material such as SiN, SiON, SiC, or $Al_2O_3$ with a thickness in the range of about 20 nm to 200 nm. In an example embodiment, a 100 nm SiN etch stop layer is deposited on 3.5 nm of CrSi. A resistor photoresist pattern, 314, is then formed on the etch stop layer, 312.

Figure 3C:
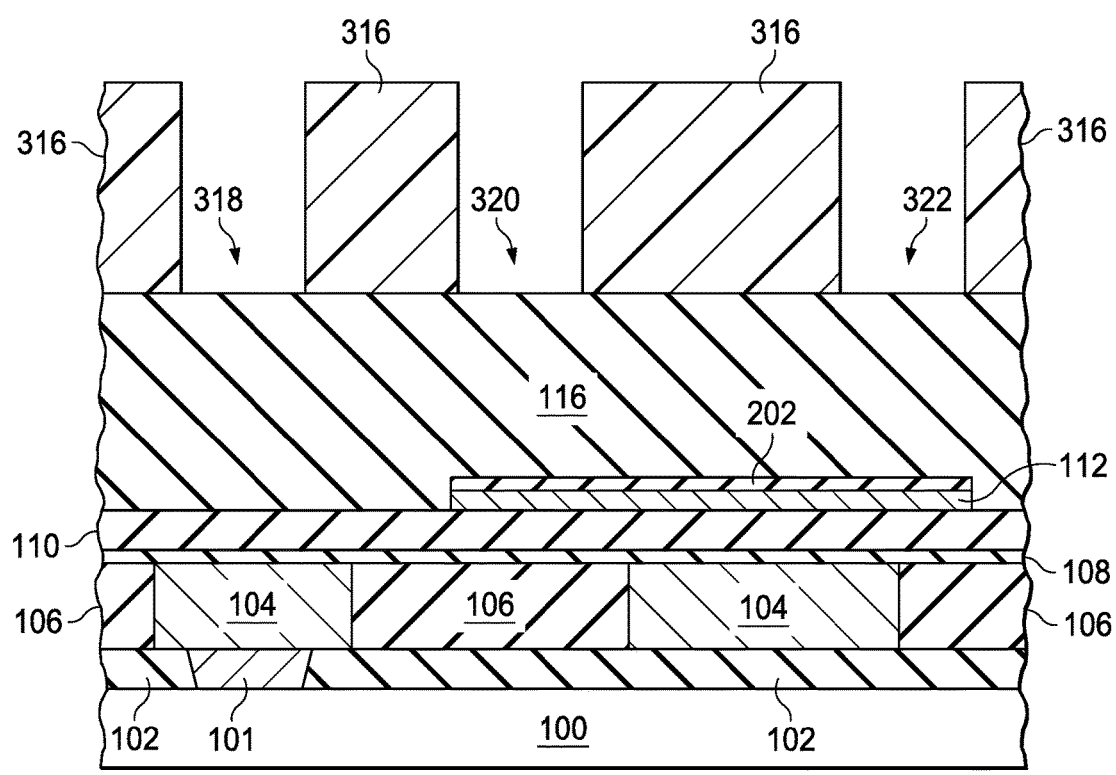

As shown in FIG. 3C, etch stop layer, 312, and resistor material, 310, are etched to form the resistor geometry 112 covered by etch stop layer geometry 202. The resistor photoresist pattern 314 is then removed. In an embodiment the etch stop layer, 312, and the resistor layer, 310, are etched using a plasma etch. IMD layer 116, which may be a dielectric such as PECVD silicon dioxide or a low-k dielectric is deposited and planarized. A via photoresist pattern 316 with openings for interconnect vias 318, and resistor vias, 320 and 322 is then formed on ILD layer 116.

Figure 3D:
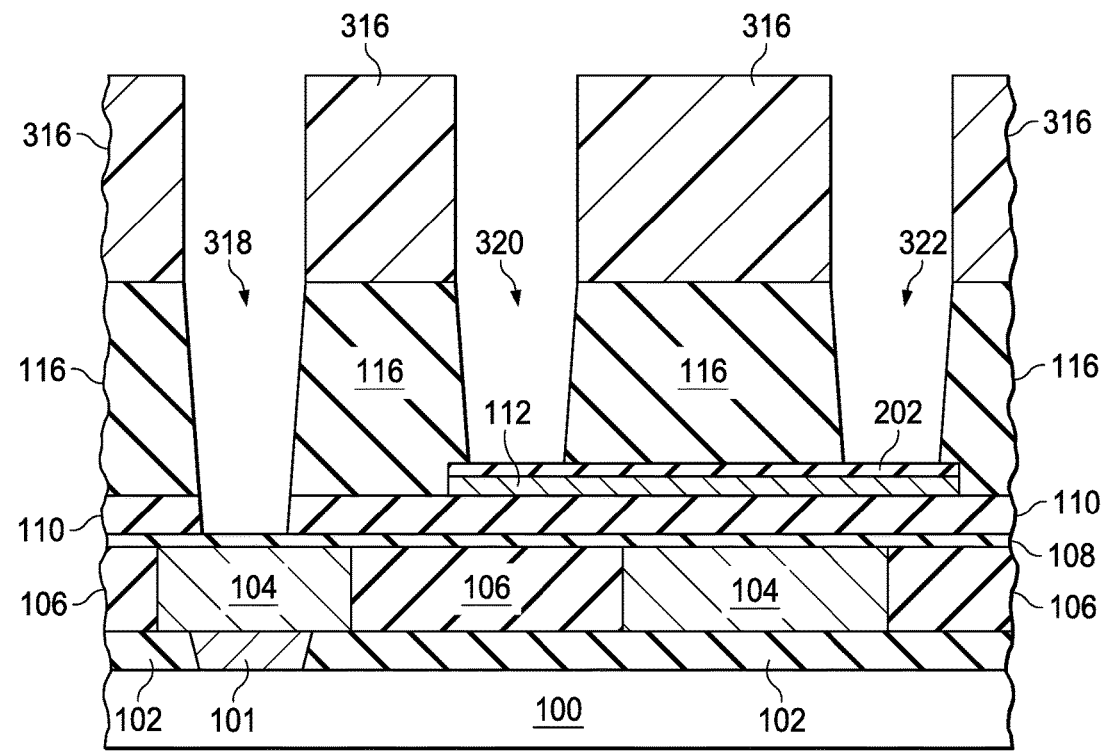

In FIG. 3D the vias, 318, 320, and 322, are etched using a plasma etch that etches silicon dioxide with high selectivity to the etch stop layers, 108 and 112. The resistor vias, 320 and 322, are etched stopping on etch stop layer 202. The interconnect vias, 318, are etched stopping on etch stop layer, 108. In an example process flow the IMD 116 is silicon dioxide and the etch stop layers 108 and 202 are silicon nitride. The first step of the via etch, etches silicon dioxide with high selectivity to silicon nitride.

Figure 3E:
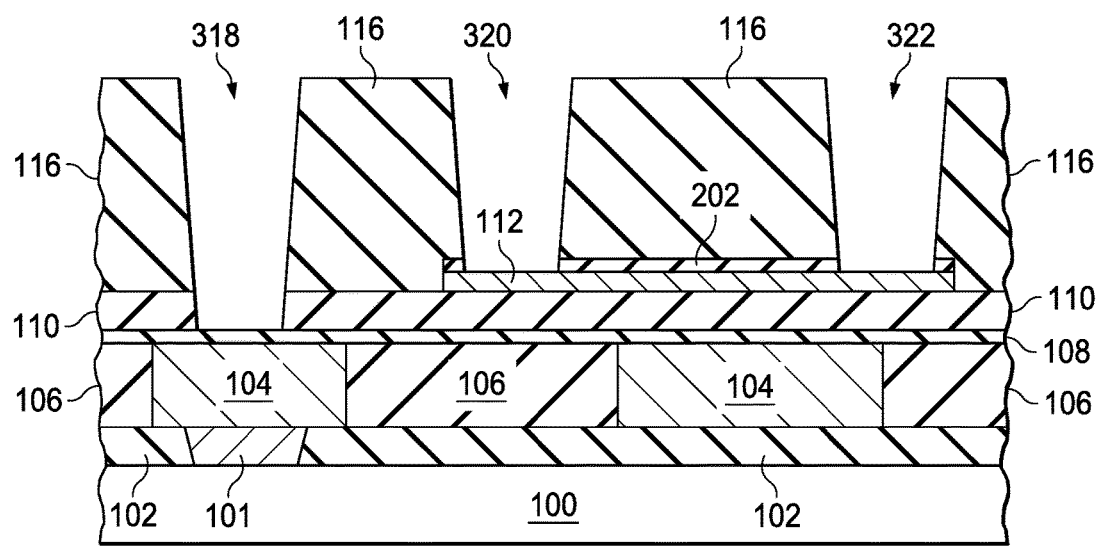

Referring now to FIG. 3E the via etch chemistry is changed to etch the etch stop layers 108 and 202. The etch stop layer 108 is etched from the bottom of the interconnect via 318, and etch stop layer 202 is etched from the bottom of the resistor vias 320 and 322. Since the etch stop layers 108 and 202 are thin (in a range of about 20 nm to 200 nm) only a short via over etch time is needed to ensure the bottoms of the vias 318, 320, and 322 are clear. Because the via over etch time is short, the via etch stops on the thin metal resistor 112 with little damage. This ensures good electrical connection between the vias 120 and 122 (FIG. 2) and the ends of the metal thin film resistor 112. The via photoresist pattern 316 is then removed.

Additional processing is then performed on the integrated circuit to fill the vias 318, 320, 322 with a conductive material such as CVD-W or copper to form via plugs 118, 120, and 122 in FIG. 2, and to form upper level interconnect geometries 124 over the via plugs 118, 120, and 122. The upper level of interconnect may be a metal such as aluminum silicon, aluminum copper deposited using PVD or may be copper deposited using electroplating.

The embodiment process for adding a metal thin film resistor to an integrated circuit manufacturing flow using only one extra photoresist pattern is disclosed.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

The invention claimed is:

1. An integrated circuit, comprising:
a first etch stop layer formed on a lower level interconnect geometry;
a first layer of dielectric overlying the first etch stop layer;
a metal thin film resistor overlying the first layer of dielectric, the metal thin film resistor having a resistive material extending from a top surface to a bottom surface of the metal thin film resistor;
a second etch stop layer overlying and in contact with the resistive material of the metal thin film resistor;
an interlevel dielectric (ILD) layer overlying the first layer of dielectric and overlying the second etch stop layer;
a first resistor via etched through the ILD layer and which connects a first upper level interconnect geometry to a first end of the metal thin film resistor;
a second resistor via etched through the ILD layer and which connects a second upper level interconnect geometry to a second end of the metal thin film resistor; and
an interconnect via which connects a third upper level interconnect geometry to the lower interconnect geometry through the ILD layer, through the first layer of dielectric, and through the first etch stop layer.

2. The integrated circuit of claim 1 where the metal thin film resistor geometry is CrSi or NiCr with a thickness in the range of about 1.5 to 40 nm.

3. The integrated circuit of claim 1 where the metal thin film resistor geometry is CrSi with a thickness of about 3.5 nm.

4. The integrated circuit of claim 1 where the first etch stop layer is a dielectric selected from the group consisting of SiN, SiON, SiC, and $Al_2O_3$ with a thickness in the range of about 20 nm to 200 nm and where the second etch stop layer is a dielectric selected from the group consisting of SiN, SiON, SiC, and $Al_2O_3$ with a thickness in the range of about 20 nm to 200 nm.

5. The integrated circuit of claim 1 where the first etch stop layer is a SiN with a thickness in the range of about 20 nm to 200 nm and where the second etch stop layer is SiN with a thickness in the range of about 20 nm to 200 nm.

6. An integrated circuit, comprising:
a first etch stop layer formed on a lower level interconnect geometry;
a first layer of dielectric overlying the first etch stop layer;
a metal thin film resistor overlying the first layer of dielectric, the metal thin film resistor having a resistive material extending from a top surface to a bottom surface of the metal thin film resistor;
a second etch stop layer deposited on and in contact with the resistive material of the metal thin film resistor;
an interlevel dielectric (ILD) layer overlying the first layer of dielectric and overlying the second etch stop layer;
a first resistor via etched through the ILD layer and through the second etch stop layer that is deposited on the metal thin film resistor, the first resistor via connecting a first upper level interconnect geometry to a first end of the metal thin film resistor;
a second resistor via etched through the ILD layer and through the second etch stop layer that is deposited on the metal thin film resistor, the second resistor via connecting a second upper level interconnect geometry to a second end of the metal thin film resistor; and
an interconnect via which connects a third upper level interconnect geometry to the lower interconnect geometry through the ILD layer, through the first layer of dielectric, and through the first etch stop layer.

7. The integrated circuit of claim 6 where the metal thin film resistor geometry is CrSi or NiCr with a thickness in the range of about 6.10 to 45 nm.

8. The integrated circuit of claim 6 where the metal thin film resistor geometry is CrSi with a thickness of about 8.10 nm.

9. The integrated circuit of claim 6 where the first etch stop layer is a dielectric selected from the group consisting of SiN, SiON, SiC, and $Al_7O_8$ with a thickness in the range of about 25 nm to 205 nm and where the second etch stop layer is a dielectric selected from the group consisting of SiN, SiON, SiC, and $Al_7O_8$ with a thickness in the range of about 25 nm to 205 nm.

10. The integrated circuit of claim 6 where the first etch stop layer is a SiN with a thickness in the range of about 25 nm to 205 nm and where the second etch stop layer is SiN with a thickness in the range of about 25 nm to 205 nm.

11. An integrated circuit, comprising:
a first etch stop layer formed on a lower level interconnect geometry;
a first layer of dielectric overlying the first etch stop layer;
a metal thin film resistor overlying the first layer of dielectric, the metal thin film resistor having a resistive material extending from a top surface to a bottom surface of the metal thin film resistor;
a second etch stop layer deposited on the resistive material of the metal thin film resistor;
an interlevel dielectric (ILD) layer overlying the first layer of dielectric and overlying the second etch stop layer;
a first resistor via etched through the ILD layer and which connects a first upper level interconnect geometry to a first end of the metal thin film resistor;
a second resistor via etched through the ILD layer and which connects a second upper level interconnect geometry to a second end of the metal thin film resistor; and
an interconnect via which connects a third upper level interconnect geometry to the lower interconnect geometry through the ILD layer, through the first layer of dielectric, and through the first etch stop layer.

12. The integrated circuit of claim 11 where the metal thin film resistor geometry is CrSi or NiCr with a thickness in the range of about 11.15 to 50 nm.

13. The integrated circuit of claim 11 where the metal thin film resistor geometry is CrSi with a thickness of about 13.15 nm.

14. The integrated circuit of claim 11 where the first etch stop layer is a dielectric selected from the group consisting of SiN, SiON, SiC, and $Al_{12}O_{13}$ with a thickness in the range of about 30 nm to 210 nm and where the second etch stop layer is a dielectric selected from the group consisting of SiN, SiON, SiC, and $Al_{12}O_{13}$ with a thickness in the range of about 30 nm to 210 nm.

15. The integrated circuit of claim 11 where the first etch stop layer is a SiN with a thickness in the range of about 30 nm to 210 nm and where the second etch stop layer is SiN with a thickness in the range of about 30 nm to 210 nm.

* * * * *